United States Patent
Ranganathan et al.

(10) Patent No.: US 8,072,096 B2
(45) Date of Patent: *Dec. 6, 2011

(54) INTEGRATED CIRCUIT WITH MULTIPLE INDEPENDENT POWER SUPPLY ZONES

(75) Inventors: Sumant Ranganathan, Sunnyvale, CA (US); Pieter Vorenkamp, Laguna Niguel, CA (US); Neil Y. Kim, Laguna Niguel, CA (US); Chun-ying Chen, Irvine, CA (US)

(73) Assignee: Broadcom Corporation

( * ) Notice: Subject to any disclaimer, the term of this patent is extended or adjusted under 35 U.S.C. 154(b) by 0 days.

This patent is subject to a terminal disclaimer.

(21) Appl. No.: 12/829,980

(22) Filed: Jul. 2, 2010

(65) Prior Publication Data

US 2010/0271113 A1   Oct. 28, 2010

Related U.S. Application Data

(63) Continuation of application No. 11/166,954, filed on Jun. 24, 2005, now Pat. No. 7,750,500.

(60) Provisional application No. 60/583,517, filed on Jun. 28, 2004.

(51) Int. Cl.
*H02J 1/10* (2006.01)
(52) U.S. Cl. ........................................... 307/43
(58) Field of Classification Search .................. 307/11, 307/18, 28, 43, 80, 85
See application file for complete search history.

(56) References Cited

U.S. PATENT DOCUMENTS

| 4,511,914 A | 4/1985 | Remedi et al. |
| 6,560,141 B2 | 5/2003 | Osada et al. |
| 7,750,500 B2 * | 7/2010 | Ranganathan et al. ......... 307/43 |

OTHER PUBLICATIONS

Fujitsu, Evaluation Board Manual for MB39A 112, Apr. 2003, Fujitsu, Rev 1.0E.
Intel, Design Guide for Intel PXA Processor, Mar. 2003, Intel, Rev. 001, pp. i to viii; 1-1 to 1-16; 8-1 to 8-10; B-1 to B18.
Fujitsu, Datasheet for MB39A112, 2003, Fujitsu.

* cited by examiner

*Primary Examiner* — Jared Fureman
*Assistant Examiner* — Carlos Amaya
(74) *Attorney, Agent, or Firm* — McAndrews, Held & Malloy, Ltd.

(57) ABSTRACT

An integrated circuit comprising multiple independent power supply zones at substantially the same voltage level and a method for utilizing such power supply zones. An integrated circuit may comprise a first module and may, for example, comprise a second module. A first power supply bus may communicate first electrical power to the first module, where the first electrical power is characterized by a first set of power characteristics comprising a first voltage level. A second power supply bus may communicate second power to the second module, where the second power is characterized by a second set of power characteristics comprising a second voltage level that is substantially similar to the first voltage level. The second set of power characteristics may, for example, be substantially different than the first set of power characteristics. The second power supply bus may also, for example, communicate the second electrical power to the first module.

26 Claims, 4 Drawing Sheets

INTEGRATED CIRCUIT WITH MULTIPLE INDEPENDENT POWER SUPPLY ZONES

CROSS-REFERENCE TO RELATED APPLICATIONS/INCORPORATION BY REFERENCE

This patent application is a continuation of U.S. patent application Ser. No. 11/166,954, filed Jun. 24, 2005, issuing as U.S. Pat. No. 7,750,500 on Jul. 6, 2010; which claims benefit from and priority to provisional patent application Ser. No. 60/583,517, filed Jun. 28, 2004. The above-identified applications are hereby incorporated herein by reference in their entirety.

FEDERALLY SPONSORED RESEARCH OR DEVELOPMENT

Not Applicable

SEQUENCE LISTING

Not Applicable

MICROFICHE/COPYRIGHT REFERENCE

Not Applicable

BACKGROUND OF THE INVENTION

Various circuits, modules or sub-circuits in an electrical circuit (e.g., an integrated circuit) may have varying power supply requirements and/or may operate optimally when supplied with power having particular characteristics. Various circuits, modules or sub-circuits in an electrical circuit may also, for example, be relatively tolerant of power supply characteristics while other various circuits, modules or sub-circuits may be relatively sensitive to power supply characteristics.

Power supply characteristics may vary in a variety of ways. For example, power supply characteristics may vary in voltage (or current) level, noise level, variability (e.g., tolerance range, amount of ripple, variance, drift, etc.), load response characteristics, etc. Various power supply characteristics may be associated with respective power supply quality levels. For example, a power supply with a tightly regulated voltage with low ripple, low noise and a fast load response may be considered a relatively high quality power supply. Conversely for example, a power supply with a loosely regulated voltage with large ripple, a substantial noise component and slow load response may be considered a relatively low quality power supply.

Providing electrical power at a relatively high quality may require the consumption of more energy (e.g., by power supply circuitry) than providing electrical power at a relatively low quality level. In various system designs, power supply buses may be designed to provide power to a set of chips or modules in accordance with the needs of a subset of chips or modules that have the strictest power supply requirements. Such designs may unnecessarily waste energy resources.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Various aspects of the present invention provide an integrated circuit comprising multiple independent power supply zones at substantially the same voltage level and a method for utilizing such power supply zones in an integrated circuit, substantially as shown in and/or described in connection with at least one of the figures, as set forth more completely in the claims. These and other advantages, aspects and novel features of the present invention, as well as details of illustrative aspects thereof, will be more fully understood from the following description and drawings.

DETAILED DESCRIPTION OF THE INVENTION

Figure 1:
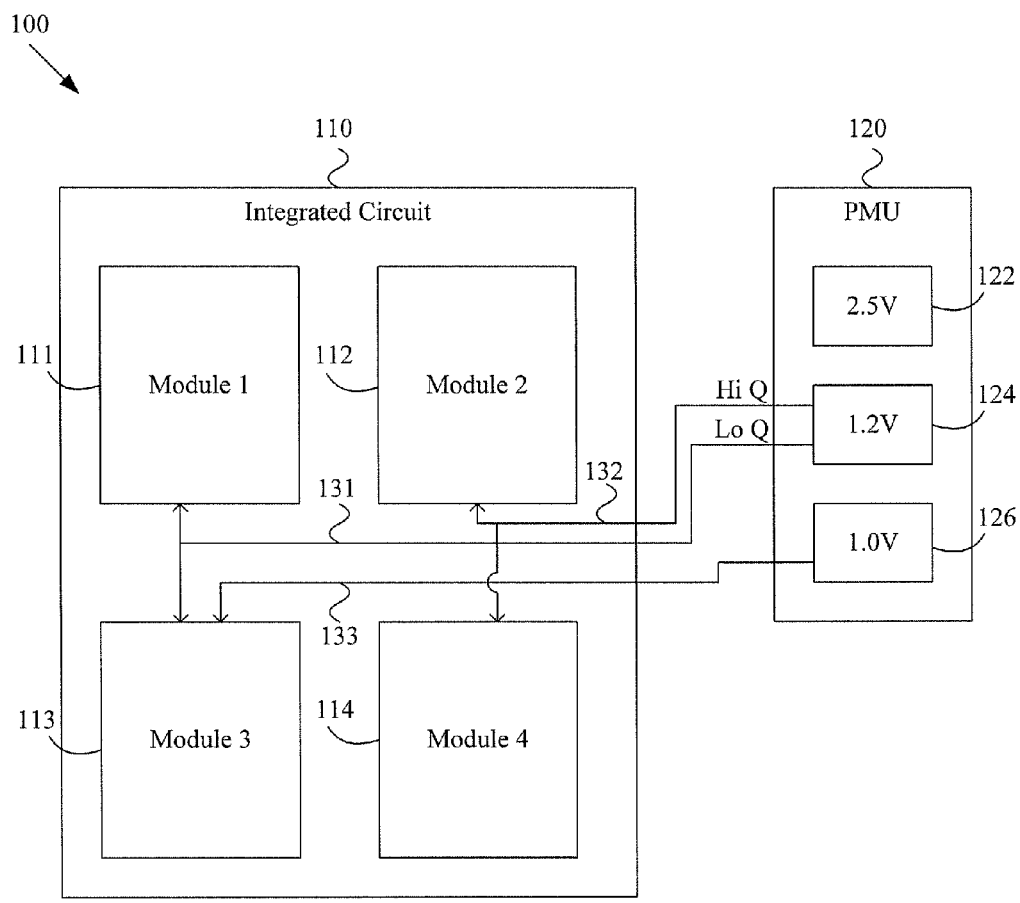
FIG. 1 shows a block diagram of an exemplary system utilizing multiple independent power supply zones, in accordance with various aspects of the present invention.

FIG. 1 shows a block diagram of an exemplary system 100 utilizing multiple independent power supply zones, in accordance with various aspects of the present invention. The exemplary system 100 may comprise an integrated circuit 110 and a power supply 120 (e.g., a power management unit).

The exemplary power supply 120 may provide electrical power to the exemplary integrated circuit 110. Electrical power may be characterized by a set of power characteristics. For example a first electrical power may be characterized by a first set of power characteristics. Such power characteristics may comprise any of a large variety of known power characteristics. For example and without limitation, such power characteristics may comprise voltage characteristics (e.g., voltage level, voltage noise level, voltage load response characteristics, or any measure of voltage variability, including ripple, drift, variance, tolerance range, etc.). Also for example, such power characteristics may comprise electrical current characteristics (e.g., current level, amount of current fluctuation, current limit, any measure of current variability, current spike suppression, current load response characteristics, etc.). Further for example, such power characteristics may comprise any of various metrics associated with electrical power and/or energy. Accordingly, the scope of various aspects of the present invention should not be limited by one or more particular characteristics of electrical power.

Note that in various scenarios, a set of power characteristics may be associated with a power quality level. For example, higher quality power characteristics may have relatively low noise, relatively fast load response characteristics, relatively low ripple or other forms of variability, relatively high current capability, etc. Accordingly, a set of power characteristics may, at times, be associated with a particular power quality level. However, the scope of various aspects of the present invention should not be limited by any arbitrary association between notions of power quality and particular power characteristics.

The exemplary power supply 120 may comprise a first power module 122, second power module 124 and third power module 126. The first power module 122 may, for example and without limitation, generally provide first electrical power characterized by a first set of power characteristics. In the exemplary power supply 120 illustrated in FIG. 1, the first set of power characteristics may comprise a first voltage level of approximately 2.5 Volts at a relatively moderate quality level. For example, the first set of power characteristics may comprise a relatively moderate voltage tolerance (e.g., 10%), a relatively moderate current limit (e.g., 1 Amp), a relatively moderate response to changes in load, a relatively moderate noise level, etc.

The second power module 124 may provide second electrical power characterized by a second set of power characteristics. In the exemplary power supply circuit 120 illustrated in FIG. 1, the second set of power characteristics may comprise a second voltage level of approximately 1.2 Volts at a relatively high quality level. For example, the second set of power characteristics may comprise a relatively tight voltage tolerance (e.g., +/−2%), a relatively high current limit (e.g., 2 Amps), a relatively fast response to changes in load, a relatively low noise level, etc.

The second power module 124 may also provide third electrical power characterized by a third set of power characteristics. In the exemplary power supply circuit 120 illustrated in FIG. 1, the third set of power characteristics may comprise a third voltage level of approximately 1.2 Volts at a relatively low quality level. For example, the third set of power characteristics may comprise a relatively loose voltage tolerance (e.g., +/−15%), a relatively low current limit (e.g., 500 mA), a relatively slow response to changes in load, a relatively high noise level, etc.

In a non-limiting exemplary scenario, the third voltage level and the second voltage level may be substantially similar. For example, the third voltage level and the second voltage level may be in a same voltage range for which a powered electrical device is generally designed to operate. For example and without limitation, in an exemplary scenario, where a powered device (or module thereof) is generally designed to operate at 1.2V+/−10%, the second voltage level (e.g., 1.1V) may be substantially similar to the third voltage level (e.g., 1.3V). Alternatively, for example, in an exemplary scenario where a first powered device is generally designed to operate at 1.0V+/−10%, and a second powered device is generally designed to operate at 1.2V+/−10%, an exemplary second voltage level of 1.05V to operate the first powered device may be substantially different than an exemplary third voltage level of 1.1V to operate the second powered device (e.g., because the second powered device might not work properly at 1.05V). Thus, whether a difference in voltage level is substantial is context dependent.

Continuing the non-limiting exemplary scenario, while the third and second voltage levels may be substantially similar, the third set of power characteristics and the second set of power characteristics may be substantially different. For example, the second and third sets of power characteristics may be substantially different in power characteristics other than voltage level. For example and without limitation, the second set of power characteristics may comprise a relatively low voltage ripple level (e.g., +/−2%), while the third set of power characteristics may comprise a relatively high voltage ripple level (e.g., +/−15%). Also for example, the second set of power characteristics may comprise a relatively low amount of noise, while the third set of power characteristics comprises a relatively high amount of electrical noise. Further for example, the second set of power characteristics may comprise a relatively fast load response, while the third set of power characteristics may comprise a relatively slow load response. Still further for example, the second set of power characteristics may comprise a relatively high current limit, while the third set of power characteristics may comprise a relatively low current limit.

As with the voltage level characteristic discussed previously, whether a particular power characteristic is substantially different than a corresponding power characteristic is context dependent. For example and without limitation, in an exemplary scenario where utilizing or generating electrical power having 5% voltage ripple will consume significantly more energy than utilizing or generating electrical power having 10% voltage ripple, such a difference might be considered to be substantial. Also for example, in an exemplary scenario where utilizing or generating electrical power having a 15% signal-to-noise ratio is not significantly different (e.g., in energy consumption or circuit performance) than utilizing or generating electrical power having a 10% signal-to-noise ratio, such a difference might not be considered to be substantial. The previously examples are merely exemplary illustrations to show that whether a power characteristic difference is substantial or not may be context-dependent. Accordingly, the scope of various aspects of the present invention should not be limited by characteristics of the previous examples.

The third power module 126 may provide fourth electrical power characterized by a fourth set of power characteristics. In the exemplary power supply circuit 120 illustrated in FIG. 1, the fourth set of power characteristics may comprise a fourth voltage level of approximately 1.0 Volts are a relatively moderate quality level. For example, the fourth set of power characteristics may comprise a relatively moderate voltage tolerance (e.g., 8%), a relatively moderate current limit (e.g., 800 mA), a relatively moderate response to changes in load, a relatively moderate noise level, etc.

The exemplary integrated circuit 110 may comprise a first module 111, second module 112, third module 113 and fourth module 114. The exemplary modules 111-114 may comprise any of a large variety of electrical circuits and circuit characteristics. For example and without limitation, any of the exemplary modules 111-114 may comprise a signal processing module (e.g., a video, audio or data processing module). Also, for example, any of the exemplary modules 111-114 may comprise a microprocessor, memory device, control circuit, communication circuit, programmable logic device, passive or active electrical components, etc. Accordingly, the scope of various aspects of the present invention should not be limited by characteristics of a particular integrated circuit module type or circuitry that may be contained in an integrated circuit module.

The exemplary integrated circuit 110 may comprise a first power supply bus 131 that communicates electrical power to one or more modules of the integrated circuit 110. For example, the first power supply bus 131 may communicate electrical power to the first module 111 and the third module 113. Such electrical power may be characterized by a set of power characteristics.

In the exemplary system 100 illustrated in FIG. 1, the first power supply bus 131 communicates the third electrical power output from the second power module 124 of the power supply 120. As discussed previously, the third electrical power is characterized by a third set of power characteristics, including a third voltage level and any of a large variety of known power characteristics.

The exemplary integrated circuit 110 may comprise a second power supply bus 132 that communicates electrical power to one or more modules of the integrated circuit 110. The second power supply bus 132 may be independent of the first power supply bus 131. For example, the first power supply bus 131 may communicate electrical power to the second module 112 and the fourth module 114. Such electrical power may be characterized by a set of power characteristics.

In the exemplary system 100 illustrated in FIG. 1, the second power supply bus 132 communicates the second electrical power output from the second power module 124 of the power supply 120. As discussed previously, the second electrical power is characterized by a second set of power characteristics, including a second voltage level and any of a large variety of known power characteristics.

As discussed previously with regard to the second power module 124, in an exemplary scenario, the second voltage level of the second electrical power may be substantially similar to the third voltage level of the third electrical power. Also as discussed previously with regard to the second power module 124, the second set of power characteristics that characterizes the second electrical power may be substantially different than the third set of power characteristics that characterizes the third electrical power. For example, in the exemplary scenario, the second power supply bus 132 may communicate electrical power at a substantially similar voltage level as the electrical power communicated by the first power supply bus 131, but where the electrical power communicated by the second power supply bus 132 is characterized by a different set of power characteristics than the electrical power communicated by the first power supply bus 131. As discussed previously, a set of power characteristics may comprise any of a large variety of known power characteristics, including but not limited to voltage or current level, noise level, voltage or current load response characteristics, or any measure of variability, including ripple, drift, variance, tolerance range, etc.

The second power supply bus 132 may comprise similar or different characteristics than the first power supply bus 131. For example and without limitation, the second power supply bus 132 may be designed to carry a different maximum amount of current than the first power supply bus 131. Also for example, the second power supply bus 132 may be designed with different noise reduction features (e.g., shielding) than the first power supply bus 131. Accordingly, the scope of various aspects of the present invention should not be limited by characteristics of particular bus features.

The exemplary integrated circuit 110 may comprise a third power supply bus 133 that communicates electrical power to one or more modules of the integrated circuit 110. The third power supply bus 133 may be independent of the first and second power supply buses 131, 132. For example, the third power supply bus 133 may communicate electrical power to the third module 113. Such electrical power may be characterized by a set of power characteristics.

In the exemplary system 100 illustrated in FIG. 1, the third power supply bus 133 communicates the fourth electrical power output from the third power module 126 of the power supply 120. As discussed previously, the fourth electrical power is characterized by a fourth set of power characteristics, including a fourth voltage level and any of a large variety of known power characteristics.

As discussed previously with regard to the third power module 126, in an exemplary scenario, the fourth voltage level of the fourth electrical power may be substantially different than the third voltage level of the third electrical power output from the second power module 124. In the exemplary system 100 illustrated in FIG. 1, the exemplary second and third electrical powers are characterized by respective voltage levels of approximately 1.2 Volts, which may generally, for example, power 1.2 Volt devices. Also in the exemplary system 100, the exemplary fourth electrical power is characterized by a voltage level of approximately 1.0 Volt, which may generally, for example, power 1.0 Volt devices.

In an alternative exemplary scenario, the fourth voltage level of the fourth electrical power output from the third power module 126 may be substantially similar to the third voltage level of the third electrical power output from the second power module 124. In such an alternative exemplary scenario, the fourth set of power characteristics may, for example, be substantially different than the third set of power characteristics or may be substantially similar.

Figure 2:
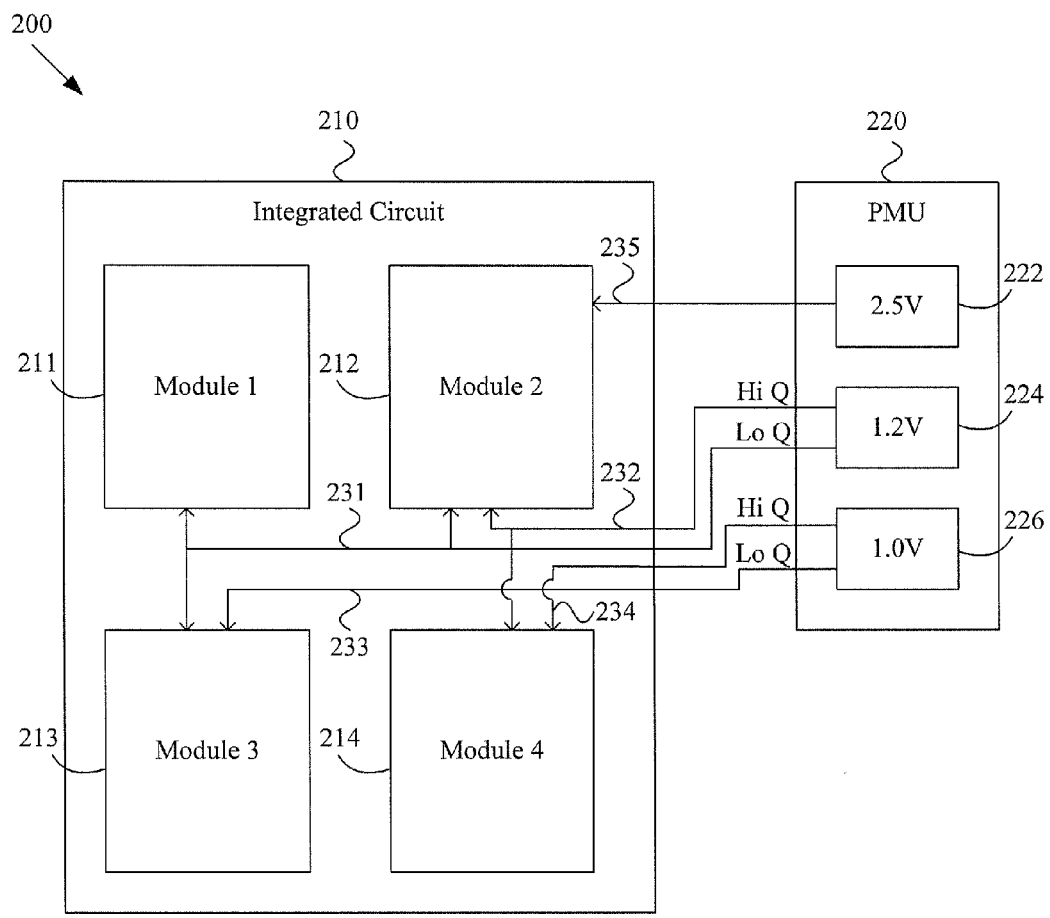
FIG. 2 shows a block diagram of an exemplary system utilizing multiple independent power supply zones, in accordance with various aspects of the present invention.

FIG. 2 shows a block diagram of an exemplary system 200 utilizing multiple independent power supply zones, in accordance with various aspects of the present invention. The exemplary system 200 may, for example and without limitation, share various characteristics with the exemplary system 100 illustrated in FIG. 1 and discussed previously. The exemplary system 200 may comprise an integrated circuit 210 and a power supply 220 (e.g., a power management unit).

The exemplary power supply 220 may provide electrical power to the exemplary integrated circuit 210. As discussed previously, the electrical power may be characterized by a set of power characteristics, which may comprise any of a large variety of power characteristics. Accordingly, the scope of various aspects of the present invention should not be limited by one or more particular characteristics of electrical power.

Note that in various scenarios, a set of power characteristics may be associated with a power quality level. For example, higher quality power characteristics may have relatively low noise, relatively fast load response characteristics, relatively low ripple or other forms of variability, relatively high current capability, etc. Accordingly, a set of power characteristics may, at times, be associated with a particular power quality level. However, the scope of various aspects of the present invention should not be limited by any arbitrary association between notions of power quality and particular power characteristics.

The exemplary power supply 220 may comprise a first power module 222, second power module 224 and third power module 226. The first power module 222 may, for example and without limitation, share various characteristics with the first power module 122 of the system 100 illustrated in FIG. 1 and discussed previously. For example, the first power module 222 may generally provide first electrical power characterized by a first set of power characteristics.

In the exemplary power supply 220 illustrated in FIG. 2, the first set of power characteristics may comprise a voltage level of approximately 2.5 Volts at a relatively moderate quality level. For example, the first set of power characteristics may comprise a relatively moderate voltage tolerance (e.g., 10%), a relatively moderate current limit (e.g., 1 Amp), a relatively moderate response to changes in load, a relatively moderate noise level, etc.

The second power module 224 may provide second electrical power characterized by a second set of power characteristics. The second power module 224 may, for example and without limitation, share various characteristics with the second power module 124 of the system 100 illustrated in FIG. 1 and discussed previously.

In the exemplary power supply circuit 220 illustrated in FIG. 2, the second set of power characteristics may comprise a voltage level of approximately 1.2 Volts at a relatively high quality level. For example, the second set of power characteristics may comprise a relatively tight voltage tolerance (e.g., +/−2%), a relatively high current limit (e.g., 2 Amps), a relatively fast response to changes in load, a relatively low noise level, etc.

The second power module 224 may also provide third electrical power characterized by a third set of power characteristics. In the exemplary power supply circuit 220 illustrated in FIG. 2, the third set of power characteristics may comprise a voltage level of approximately 1.2 Volts at a relatively low quality level. For example, the third set of power characteristics may comprise a relatively loose voltage tolerance (e.g., +/−15%), a relatively low current limit (e.g., 500 mA), a relatively slow response to changes in load, a relatively high noise level, etc.

The third power module 226 may provide fourth electrical power characterized by a fourth set of power characteristics. The third power module 226 may, for example and without limitation, share various aspects with the third power module 126 of the system 100 illustrated in FIG. 1 and discussed previously.

In the exemplary power supply circuit 220 illustrated in FIG. 2, the fourth set of power characteristics may comprise a voltage level of approximately 1.0 Volts at a relatively high quality level. For example, the fourth set of power characteristics may comprise a relatively tight voltage tolerance (e.g., +/−3%), a relatively high current limit (e.g., 4 Amps), a relatively fast response to changes in load, a relatively low noise level, etc.

The third power module 226 may also provide fifth electrical power characterized by a fifth set of power characteristics. In the exemplary power supply circuit 220 illustrated in FIG. 2, the fifth set of power characteristics may comprise a voltage level of approximately 1.0 Volts at a relatively low quality level. For example, the fifth set of power characteristics may comprise a relatively loose voltage tolerance (e.g., +/−15%), a relatively low current limit (e.g., 400 mA), a relatively slow response to changes in load, a relatively high noise level, etc.

In a non-limiting exemplary scenario, the fifth voltage level and the fourth voltage level may be substantially similar. For example, the fifth voltage level and the fourth voltage level may be in a same voltage range for which a powered electrical device is generally designed to operate. For example and without limitation, in an exemplary scenario, where a powered device (or module thereof) is generally designed to operate at 1.0V+/−10%, the fourth voltage level (e.g., 1.05V) may be substantially similar to the fifth voltage level (e.g., 0.95V). Alternatively, for example, in an exemplary scenario where a first powered device is generally designed to operate at 1.0V+/−10%, and a second powered device is generally designed to operate at 1.2V+/−10%, an exemplary fourth voltage level of 1.05V to operate the first powered device may be substantially different than an exemplary fifth voltage level of 1.1V to operate the second powered device. Thus, whether a difference in voltage level is substantial is context dependent.

Continuing the non-limiting exemplary scenario, while the fourth and fifth voltage levels may be substantially similar, the fourth set of power characteristics and the fifth set of power characteristics may, for example, be substantially different. For example, the fourth and fifth sets of power characteristics may be substantially different in power characteristics other than voltage level. For example and without limitation, the fourth set of power characteristics may comprise a relatively low voltage ripple level (e.g., +/−2.5%), while the fifth set of power characteristics may comprise a relatively high voltage ripple level (e.g., +/−12%). Also for example, the fourth set of power characteristics may comprise a relatively low amount of electrical noise, while the fifth set of power characteristics comprises a relatively high amount of electrical noise. Further for example, the fourth set of power characteristics may comprise a relatively fast load response, while the fifth set of power characteristics may comprise a relatively slow load response. Still further for example, the fourth set of power characteristics may comprise a relatively high current limit, while the fifth set of power characteristics may comprise a relatively low current limit. As discussed previously, whether a particular power characteristic is substantially different than a corresponding power characteristic is context dependent.

The exemplary integrated circuit 210 may comprise a first module 211, second module 212; third module 213 and fourth module 214. The exemplary modules 211-214 may, for example and without limitation, share various characteristics with the exemplary modules 111-114 of the system 100 illustrated in FIG. 1 and discussed previously.

For example, the exemplary modules 211-214 may comprise any of a large variety of electrical circuits. Accordingly, the scope of various aspects of the present invention should not be limited by characteristics of a particular integrated circuit module type or circuitry that may be contained in an integrated circuit module.

The exemplary integrated circuit 210 may comprise a first power supply bus 231 that communicates electrical power to one or more modules of the integrated circuit 210. For example, the first power supply bus 231 may communicate electrical power to the first module 211, second module 212 and third module 213. Such electrical power may be characterized by a set of power characteristics.

In the exemplary system 200 illustrated in FIG. 2, the first power supply bus 231 communicates the third electrical power output from the second power module 224 of the power supply 220. As discussed previously, the third electrical power is characterized by a third set of power characteristics, including a third voltage level and any of a large variety of known power characteristics.

The exemplary integrated circuit 210 may comprise a second power supply bus 232 that communicates electrical power to one or more modules of the integrated circuit 210. The second power supply bus 232 may, for example, be independent of the first power supply bus 231. For example, the second power supply bus 232 may communicate electrical power to the second module 212 and the fourth module 214. Such electrical power may be characterized by a set of power characteristics.

In the exemplary system 200 illustrated in FIG. 2, the second power supply bus 232 communicates the second electrical power output from the second power module 224 of the power supply 220. As discussed previously, the second electrical power is characterized by a second set of power characteristics, including a second voltage level and any of a large variety of known power characteristics.

As discussed previously with regard to the second power module 224, in an exemplary scenario, the second voltage level of the second electrical power may be substantially similar to the third voltage level of the third electrical power. Also as discussed previously with regard to the second power module 224, the second set of power characteristics that characterizes the second electrical power may be substantially different than the third set of power characteristics that characterizes the third electrical power. For example, in the exemplary scenario, the second power supply bus 232 may communicate electrical power at a substantially similar voltage level as the electrical power communicated by the first power supply bus 231, but where the electrical power communicated by the second power supply bus 232 is characterized by a different set of power characteristics than the electrical power communicated by the first power supply bus 231. As discussed previously, a set of power characteristics may comprise any of a large variety of known power characteristics, including but not limited to, voltage and current level, ripple amount, tolerance or other indications of variability, noise level, current limit, load response characteristics, etc.

The second power supply bus 232 may comprise similar or different characteristics than the first power supply bus 231. For example and without limitation, the second power supply bus 232 may be designed to carry a different maximum amount of current than the first power supply bus 231. Also for example, the second power supply bus 232 may be designed with different noise reduction features (e.g., shielding) than the first power supply bus 231. Accordingly, the scope of various aspects of the present invention should not be limited by characteristics of a particular power supply bus.

The exemplary integrated circuit 210 may comprise a third power supply bus 233 that communicates electrical power to one or more modules of the integrated circuit 210. The third power supply bus 233 may, for example, be independent of the first and second power supply buses 231-232. For example, the third power supply bus 233 may communicate electrical power to the third module 213. Such electrical power may be characterized by a set of power characteristics.

In the exemplary system 200 illustrated in FIG. 2, the third power supply bus 233 communicates the fifth electrical power output from the third power module 226 of the power supply 220. As discussed previously, the fifth electrical power is characterized by a fifth set of power characteristics, including a fifth voltage level and any of a large variety of known power characteristics.

The exemplary integrated circuit 210 may comprise a fourth power supply bus 234 that communicates electrical power to one or more modules of the integrated circuit 210. The fourth power supply bus 234 may, for example, be independent of the first, second and third power supply buses 231-233. For example, the fourth power supply bus 234 may communicate electrical power to the fourth module 214. Such electrical power may be characterized by a set of power characteristics.

In the exemplary system 200 illustrated in FIG. 2, the fourth power supply bus 234 communicates the fourth electrical power output from the third power module 226 of the power supply 220. As discussed previously, the fourth electrical power is characterized by a fourth set of power characteristics, including a fourth voltage level and any of a large variety of known power characteristics.

As discussed previously with regard to the third power module 226, in an exemplary scenario, the fourth voltage level of the fourth electrical power may be substantially similar to the fifth voltage level of the fifth electrical power. Also as discussed previously with regard to the third power module 226, the fourth set of power characteristics that characterizes the fourth electrical power may be substantially different than the fifth set of power characteristics that characterizes the fifth electrical power. For example, in the exemplary scenario, the fourth power supply bus 234 may communicate electrical power at a substantially similar voltage level as the electrical power communicated by the third power supply bus 233, but where the electrical power communicated by the fourth power supply bus 234 is characterized by a different set of power characteristics than the electrical power communicated by the third power supply bus 233. As discussed previously, a set of power characteristics may comprise any of a large variety of known power characteristics, including but not limited to, voltage and current level, ripple amount, tolerance or other indications of variability, noise level, current limit, load response characteristics, etc.

The fourth power supply bus 234 may comprise similar or different characteristics than the third power supply bus 233. For example and without limitation, the fourth power supply bus 234 may be designed to carry a different maximum amount of current than the third power supply bus 233. Also for example, the fourth power supply bus 234 may be designed with different noise reduction features (e.g., shielding) than the third power supply bus 233. Accordingly, the scope of various aspects of the present invention should not be limited by characteristics of a particular power supply bus.

The exemplary integrated circuit 210 may comprise a fifth power supply bus 235 that communicates electrical power to one or more modules of the integrated circuit 210. The fifth power supply bus 235 may be independent of the first, second, third and fourth power supply buses 231-234. For example, the fifth power supply bus 235 may communicate electrical power to the second module 212. Such electrical power may be characterized by a set of power characteristics.

In the exemplary system 200 illustrated in FIG. 2, the fifth power supply bus 235 communicates the first electrical power output from the first power module 222 of the power supply 220. As discussed previously, the first electrical power is characterized by a first set of power characteristics, including a first voltage level and any of a large variety of known power characteristics.

As discussed previously with regard to the first power module 222, in an exemplary scenario, the first voltage level of the first electrical power may be substantially different than the second and third voltage levels of the second and third electrical powers output from the second power module 224. Also, in the exemplary scenario, the first voltage level of the first electrical power may be substantially different than the fourth and fifth voltage levels of the fourth and fifth electrical powers output from the third power module 226. In the exemplary system 200 illustrated in FIG. 2, the exemplary second and third electrical powers are characterized by respective voltage levels of approximately 1.2 Volts, which may generally power 1.2 Volt devices, and the exemplary fourth and fifth electrical powers are characterized by respective voltage levels of approximately 1.0 Volt, which may generally power 1.0 Volt devices. Also, in the exemplary system 200, the exemplary first electrical power may be characterized by a first voltage level of approximately 2.5 Volts, which may generally power 2.5 Volt devices.

In an alternative exemplary scenario (not illustrated), the first voltage level of the first electrical power output from the first power module 222 may be substantially similar to the second and third voltage levels of the second and third electrical powers output from the second power module 224. In such an alternative exemplary scenario, the first set of power characteristics may be substantially different than the second and third sets of power characteristics or may be substantially similar.

Figure 3:
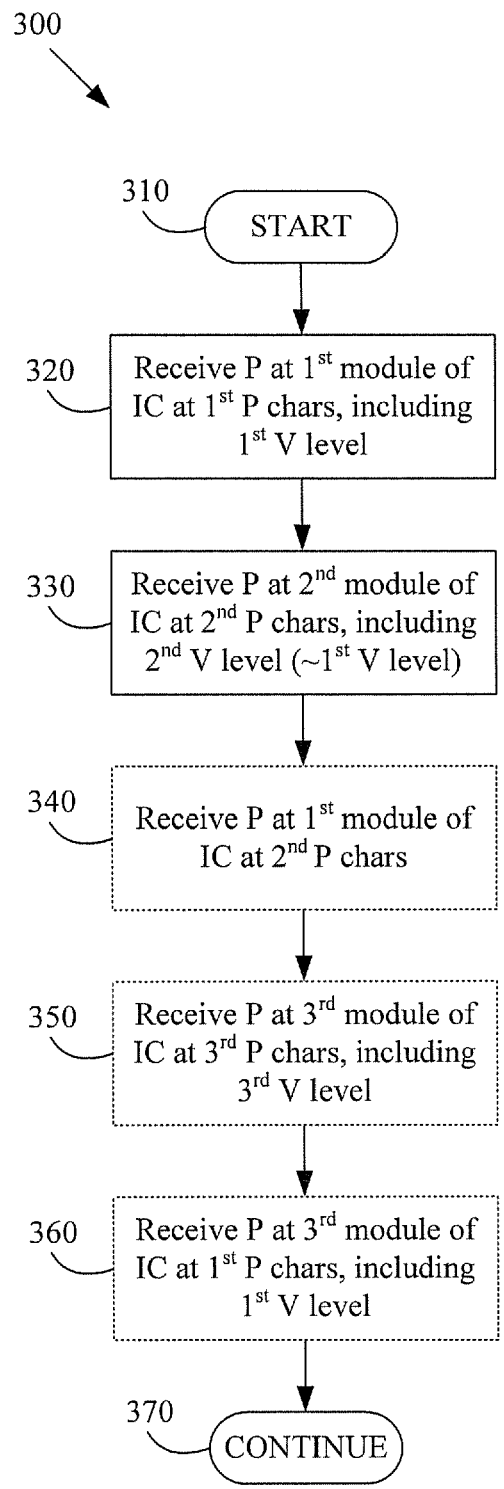
FIG. 3 shows a flow diagram of a method for utilizing multiple independent power supply zones in an integrated circuit, in accordance with various aspects of the present invention.

FIG. 3 shows a flow diagram of a method 300 for utilizing multiple independent power supply zones in an integrated circuit, in accordance with various aspects of the present invention. The exemplary method 300 may, for example and without limitation, perform various portions of the functionality discussed previously with respect to the exemplary systems 100, 200 illustrated in FIGS. 1-2 and discussed previously.

The exemplary method 300 may begin at step 310. The method 300 may begin for any of a large variety of reasons. For example and without limitation, the method 300 may execute continuously during operation of the integrated circuit. Also for example, the method 300 may begin in response to a user request or a request by operational components of the integrated circuit or another circuit. Further for example, the method 300 may begin at power-up or reset of the integrated circuit. Additionally for example, the method 300 may begin in response to real-time operating conditions of the integrated circuit. Also for example, the method 300 may begin in response to the integrated circuit entering one or more particular operating modes. Accordingly, the scope of various aspects of the present invention should not be limited by particular initiating causes or conditions.

The exemplary method 300 may, at step 320, comprise receiving first electrical power in the integrated circuit. For example, step 320 may comprise receiving first electrical power at a first module of the integrated circuit. The first electrical power may be characterized by a first set of power characteristics, including a first voltage level.

The first module may, for example and without limitation, share various aspects with the exemplary modules 111-114 and 211-214 of the exemplary systems 100, 200 illustrated in FIGS. 1-2 and discussed previously. For example, the first module may comprise any of a large variety of electrical circuits. For example and without limitation, the first module may comprise a signal processing module (e.g., a video, audio or data processing module). Also, for example, the first module may comprise a microprocessor, memory device, control circuit, communication circuit, programmable logic device, passive or active electrical components, etc. Accordingly, the scope of various aspects of the present invention should not be limited by characteristics of a particular integrated circuit module type or circuitry that may be contained in an integrated circuit module.

As discussed previously, electrical power may be characterized by a set of power characteristics. For example the first electrical power may be characterized by a first set of power characteristics. Such power characteristics may comprise any of a large variety of known power characteristics. For example and without limitation, such power characteristics may comprise voltage characteristics (e.g., voltage level, amount of voltage ripple, voltage tolerance range, voltage noise level, voltage load response characteristics, any measure of voltage variability, etc.). Also for example, such power characteristics may comprise electrical current characteristics (e.g., current level, amount of current fluctuation, current limit, any measure of current variability, current spike suppression, current load response characteristics, etc.). Further for example, such power characteristics may comprise any of various metrics associated with electrical power and/or energy. Accordingly, the scope of various aspects of the present invention should not be limited by one or more particular characteristics of electrical power.

Note that in various scenarios, a set of power characteristics may be associated with a power quality level. For example, higher quality power characteristics may have relatively low noise, relatively fast load response characteristics, relatively low ripple or other forms of variability, relatively high current capability, etc. Accordingly, a set of power characteristics may, at times, be associated with a particular power quality level. However, the scope of various aspects of the present invention should not be limited by any arbitrary association between notions of power quality and particular power characteristics.

The exemplary method 300 may, at step 330, comprise receiving second electrical power in the integrated circuit. For example, step 330 may comprise receiving second electrical power at a second module of the integrated circuit. The second electrical power may be characterized by a second set of power characteristics, including a second voltage level.

In a non-limiting exemplary scenario, the second voltage level and the first voltage level (e.g., as received by the first module at step 320) may be substantially similar. For example, the second voltage level and the first voltage level may be in a same voltage range for which a powered electrical device is generally designed to operate. For example and without limitation, in an exemplary scenario where a powered device (or module thereof) is generally designed to operate at 1.2V+/−10%, the first voltage level (e.g., 1.1V) may be substantially similar to the second voltage level (e.g., 1.3V). Alternatively, for example, in an exemplary scenario where a first powered device is generally designed to operate at 1.0V+/−10%, and a second powered device is generally designed to operate at 1.2V+/−10%, an exemplary first voltage level of 1.05V to operate the first powered device may be substantially different than an exemplary second voltage level of 1.1V to operate the second powered device. Thus, whether a difference in voltage level is substantial is context dependent.

Continuing the non-limiting exemplary scenario, while the first and second voltage levels may be substantially similar, a portion of the first set of power characteristics and a corresponding portion of the second set of power characteristics may be substantially different. For example, the first and second sets of power characteristics may be substantially different in one or more power characteristics other than voltage level. For example and without limitation, the first set of power characteristics may comprise a relatively low voltage ripple level (e.g., +/−2%), while the second set of power characteristics may comprise a relatively high voltage ripple level (e.g., +/−15%). Also for example, the first set of power characteristics may comprise a relatively low amount of noise, while the second set of power characteristics comprises a relatively high amount of electrical noise. Further for example, the first set of power characteristics may comprise a relatively fast load response, while the second set of power characteristics may comprise a relatively slow load response. Still further for example, the first set of power characteristics may comprise a relatively high current limit, while the second set of power characteristics may comprise a relatively low current limit.

As discussed previously, whether a particular power characteristic is substantially different than a corresponding power characteristic is context dependent. For example and without limitation, in an exemplary scenario where utilizing or generating electrical power having 5% voltage ripple will consume significantly more energy than utilizing or generating electrical power having 10% voltage ripple, such a difference might be considered to be substantial. Also for example, in an exemplary scenario where utilizing or generating electrical power having a 15% signal-to-noise ratio is not significantly different (e.g., in energy consumption or circuit performance) than utilizing or generating electrical power having a 10% signal-to-noise ratio, such a difference might not be considered to be substantial. The previously examples are merely exemplary illustrations to show that whether a power characteristic difference is substantial or not may be context-dependent. Accordingly, the scope of various aspects of the present invention should not be limited by characteristics of the previous examples.

The exemplary method 300, as illustrated in FIG. 3, may optionally comprise performing functionality in addition to that discussed previously with regard to steps 320-330. For example, the exemplary method 300 may, at step 340, comprise, while receiving the first electrical power at the first module (e.g., at step 320), also receiving the second electrical power at the first module. For example, the first module may simultaneously receive the first electrical power and the second electrical power. In an exemplary scenario, the first voltage level of the first electrical power and the second voltage level of the second electrical power may be substantially similar. Also in the exemplary scenario, the first set of power characteristics of the first electrical power and the second set of power characteristics of the second electrical power may be substantially different (e.g., in one or more corresponding characteristics other than voltage level).

The exemplary method 300 may, at step 350, comprise, while receiving the first electrical power at the first module (e.g., at step 320), receiving third electrical power at a third module of the integrated circuit. The third electrical power may be characterized by a third set of power characteristics, including a third voltage level. In an exemplary scenario, the third voltage level may be substantially different than the first and second voltage levels. In an alternative scenario, the third voltage level may be substantially similar to the first and second voltage levels, while the third set of power characteristics may be substantially different than the first and second sets of power characteristics.

The exemplary method 300 may, at step 360, comprise, while receiving the first electrical power at the first module (e.g., at step 320), receiving the first electrical power at a third module. For example, the first and third modules may simultaneously receive the first electrical power, where the first electrical power is characterized by the first set of power characteristics, including the first voltage level.

The exemplary method 300 may, at step 370, comprise continuing further operation. For example and without limitation, step 370 may comprise returning the flow of the method 300 back to step 310 for repeat operation. Also for example, step 370 may comprise performing further power-related operations. Further for example, step 370 may comprise performing operational activities (e.g., as may be performed by the first, second and/or third modules). In general, step 370 may comprise performing continued operation. Accordingly, the scope of various aspects of the present invention should not be limited by characteristics of a particular type of continued operation.

The exemplary method 300, illustrated in FIG. 3 and discussed previously, was presented to provide specific illustrations of various generally broader aspects of the present invention. Accordingly, by no means should the scope of various aspects of the present invention be limited by particular characteristics of the exemplary method 300.

Figure 4:
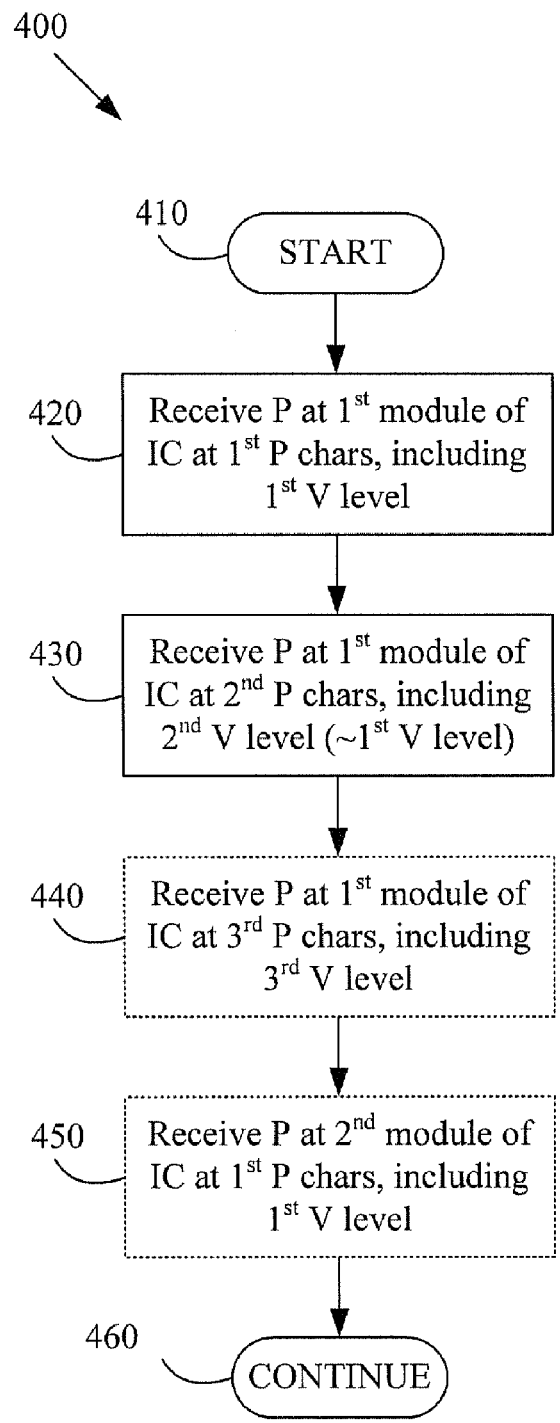
FIG. 4 shows a flow diagram of a method for utilizing multiple independent power supply zones in an integrated circuit, in accordance with various aspects of the present invention.

FIG. 4 shows a flow diagram of a method 400 for utilizing multiple independent power supply zones in an integrated circuit, in accordance with various aspects of the present invention. The exemplary method 400 may, for example and without limitation, perform various portions of the functionality discussed previously with respect to the exemplary systems 100, 200 illustrated in FIGS. 1-2 and discussed previously. The exemplary method 400 may also, for example and without limitation, share various characteristics with the exemplary method 300 illustrated in FIG. 3 and discussed previously.

The exemplary method 400 may begin at step 410. As discussed previously with regard to the exemplary method 300 illustrated in FIG. 3, the method 400 may begin for any of a large variety of reasons. Accordingly, the scope of various aspects of the present invention should not be limited by particular initiating causes or conditions.

The exemplary method 400 may, at step 420, comprise receiving first electrical power in the integrated circuit. For example, step 420 may comprise receiving first electrical power at a first module of the integrated circuit. The first electrical power may be characterized by a first set of power characteristics, including a first voltage level. Step 420 may, for example and without limitation, share various characteristics with step 320 of the exemplary method 300 illustrated in FIG. 3 and discussed previously.

The first module may, for example and without limitation, share various aspects with the exemplary modules 111-114 and 211-214 of the exemplary systems 100, 200 illustrated in FIGS. 1-2 and discussed previously. For example, the first module may comprise any of a large variety of electrical circuits. Accordingly, the scope of various aspects of the present invention should not be limited by characteristics of a particular integrated circuit module type or circuitry that may be contained in an integrated circuit module.

As discussed previously, electrical power may be characterized by a set of power characteristics. For example the first electrical power may be characterized by a first set of power characteristics. Such power characteristics may comprise any of a large variety of known power characteristics. Accordingly, the scope of various aspects of the present invention should not be limited by one or more particular characteristics of electrical power.

The exemplary method 400 may, at step 430, comprise receiving second electrical power in the integrated circuit. For example, step 430 may comprise receiving second electrical power at the first module of the integrated circuit. The second electrical power may be characterized by a second set of power characteristics, including a second voltage level.

In a non-limiting exemplary scenario, the second voltage level and the first voltage level (e.g., as received by the first module at step 420) may be substantially similar. Additionally, for example, while the first and second voltage levels may be substantially similar, the first set of power characteristics and the second set of power characteristics may be substantially different. As discussed previously, whether a particular power characteristic is substantially different than a corresponding power characteristic is context dependent.

The exemplary method 400, as illustrated in FIG. 4, may optionally comprise performing functionality in addition to that discussed previously with regard to steps 420-430. For example, the exemplary method 400 may, at step 440, comprise receiving third electrical power at the first module of the integrated circuit. The third electrical power may be characterized by a third set of power characteristics, including a third voltage level.

In a non-limiting exemplary scenario, the third voltage level and the first and/or second voltage levels (e.g., as received by the first module at steps 420 and 430) may be substantially similar. Additionally, for example, while the third, first and/or second voltage levels may be substantially similar, the third set of power characteristics may be substantially different than the first and/or second sets of power characteristics. As discussed previously, whether a particular power characteristic is substantially different than a corresponding power characteristic is context dependent.

The exemplary method 400 may, at step 450, comprise receiving the first electrical power at a second module of the integrated circuit. For example, the first module and second module may receive the first electrical power simultaneously. For example and without limitation, the first module and second module may receive the first electrical power over the same power supply bus.

The exemplary method 400 may, at step 460, comprise continuing further operation. For example and without limitation, step 460 may comprise returning the flow of the method 400 back to step 410 for repeat operation. Also for example, step 460 may comprise performing further power-related operations. Further for example, step 460 may comprise performing operational activities (e.g., as may be performed by the first and/or second modules). In general, step 460 may comprise continued operation. Accordingly, the scope of various aspects of the present invention should not be limited by characteristics of a particular type of continued operation.

The exemplary method 400, illustrated in FIG. 4 and discussed previously, was presented to provide specific illustrations of various generally broader aspects of the present invention. Accordingly, by no means, should the scope of various aspects of the present invention be limited by particular characteristics of the exemplary method 400.

The prior exemplary illustrations in FIGS. 1-4 were merely exemplary, and accordingly, the scope of various aspects of the present invention should not be limited by characteristics of particular features or aspects of the exemplary illustrations.

It should be stressed that various aspects of the present invention may be performed by hardware, a processor executing software instructions, or a combination thereof. Also, it should be noted that various modules and method steps might be implemented in hardware or software in varying degrees of integration. Accordingly, the scope of various aspects of the present invention should not be limited by characteristics of any particular implementation.

In summary, various aspects of the present invention provide a system and method for utilizing, in an integrated circuit, multiple independent power supply zones at substantially the same voltage level. While the invention has been described with reference to certain aspects and embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. An integrated circuit, comprising:
    a first module;
    a first internal power supply bus operable to, during normal operation of the integrated circuit, receive electrical power from a power supply circuit and communicate first electrical power to the first module, where the first electrical power is characterized by a first set of power characteristics that comprises a first voltage level and a first level of power quality; and
    a second internal power supply bus, independent of the first internal power supply bus, operable to, during normal operation of the integrated circuit, receive electrical power from a power supply circuit and communicate second electrical power to the first module while the first internal power supply bus is communicating the first electrical power to the first module, wherein the second electrical power is characterized by a second set of power characteristics that comprises a second voltage level and a second level of power quality,
    wherein the first level of power quality is different from the second level of power quality.

2. The integrated circuit of claim 1, wherein the first voltage level and the second voltage level are substantially similar.

3. The integrated circuit of claim 2, further comprising a second module, independent of the first module, that operates to receive electrical power from the first internal power supply bus and not from the second internal power supply bus.

4. The integrated circuit of claim 2, further comprising a third internal power supply bus, independent of the first and second internal power supply buses, that operates to communicate third electrical power to the first module, wherein the third electrical power is characterized by a third set of power characteristics that comprises a third voltage level, and the third voltage level is substantially different from the first and second voltage levels.

5. The integrated circuit of claim 2, wherein the first level of power quality is characterized by a first amount of voltage ripple, and the second level of power quality is characterized by a second amount of voltage ripple that is different from the first amount of voltage ripple.

6. The integrated circuit of claim 2, wherein the first level of power quality is characterized by a first voltage noise level, and the second level of power quality is characterized by a second voltage noise level that is different from the first voltage noise level.

7. The integrated circuit of claim 2, wherein the first level of power quality is characterized by a first amount of voltage drift, and the second level of power quality is characterized by a second amount of voltage drift that is different from the first amount of voltage drift.

8. The integrated circuit of claim 2, wherein the first level of power quality is characterized by a first voltage tolerance range, and the second level of power quality is characterized by a second voltage tolerance range that is different from the first voltage tolerance range.

9. The integrated circuit of claim 2, wherein the first level of power quality is characterized by a first voltage load response, and the second level of power quality is characterized by a second voltage load response that is different from the first voltage load response.

10. The integrated circuit of claim 2, wherein the first internal power supply bus comprises first noise reduction features, and the second internal power supply bus comprises second noise reduction features that are different from the first noise reduction features.

11. The integrated circuit of claim 2, wherein the power supply circuit from which the first internal power supply bus receives electrical power and the power supply circuit from which the second internal power supply bus receives electrical power are disposed in a power management unit that is external to the integrated circuit.

12. The integrated circuit of claim 2, wherein the electrical power received by the first internal power supply bus is produced by power supply circuitry at a first level of energy efficiency, and the electrical power received by the second internal power supply bus is produced by power supply circuitry at a second level of energy efficiency that is different from the first level of energy efficiency.

13. The integrated circuit of claim 2, wherein the first module is an audio and/or video signal processing module.

14. A method for receiving electrical power, the method comprising:
    in an integrated circuit comprising a first internal power supply bus and a second internal power supply bus independent of the first internal power supply bus, at least:
        receiving, during normal operation of the integrated circuit, at a first module of the integrated circuit, first electrical power from a power supply circuit via the first internal power supply bus, wherein the received first electrical power is characterized by a first set of power characteristics comprising a first voltage level and a first level of power quality; and while receiving the first electrical power at the first module, receiving, at the first module, second electrical power from a power supply circuit via the second internal power supply bus, wherein the received second electrical power is characterized by a second set of power characteristics comprising a second voltage level and a second level of power quality, wherein the first voltage level is substantially similar to the second voltage level, and the first level of power quality is different from the second level of power quality.

15. The method of claim 14, wherein the first voltage level and the second voltage level are substantially similar.

16. The method of claim 14, comprising receiving at a second module, independent of the first module, electrical power from the first internal power supply bus and not from the second internal power supply bus.

17. The method of claim 14, comprising receiving at the first module, third electrical power from a power supply circuit via a third internal power supply bus of the integrated circuit independent of the first and second internal power supply buses, wherein the third electrical power is characterized by a third set of power characteristics that comprises a third voltage level, and the third voltage level is substantially different from the first and second voltage levels.

18. The method of claim 14, wherein the first level of power quality is characterized by a first amount of voltage ripple, and the second level of power quality is characterized by a second amount of voltage ripple that is different from the first amount of voltage ripple.

19. The method of claim 14, wherein the first level of power quality is characterized by a first voltage noise level, and the second level of power quality is characterized by a second voltage noise level that is different from the first voltage noise level.

20. The method of claim 14, wherein the first level of power quality is characterized by a first amount of voltage drift, and the second level of power quality is characterized by a second amount of voltage drift that is different from the first amount of voltage drift.

21. The method of claim 14, wherein the first level of power quality is characterized by a first voltage tolerance range, and the second level of power quality is characterized by a second voltage tolerance range that is different from the first voltage tolerance range.

22. The method of claim 14, wherein the first level of power quality is characterized by a first voltage load response, and the second level of power quality is characterized by a second voltage load response that is different from the first voltage load response.

23. The method of claim 14, wherein the first internal power supply bus comprises first noise reduction features, and the second internal power supply bus comprises second noise reduction features that are different from the first noise reduction features.

24. The method of claim 14, wherein the power supply circuit from which the first internal power supply bus receives electrical power and the power supply circuit from which the second internal power supply bus receives electrical power are disposed in a power management unit that is external to the integrated circuit.

25. The method of claim 14, wherein the electrical power received by the first internal power supply bus is produced by power supply circuitry at a first level of energy efficiency, and the electrical power received by the second internal power supply bus is produced by power supply circuitry at a second level of energy efficiency that is different from the first level of energy efficiency.

26. The method of claim 14, wherein the first module is an audio and/or video signal processing module.

* * * * *